(12) United States Patent
Kojima

(10) Patent No.: US 7,307,554 B2
(45) Date of Patent: Dec. 11, 2007

(54) PARALLEL DATA TRANSMISSION METHOD AND PARALLEL DATA TRANSMISSION SYSTEM

(75) Inventor: Osamu Kojima, Mihama-ku (JP)

(73) Assignee: Kawasaki Microelectronics, Inc., Mihama-ku (JP)

( * ) Notice: Subject to any disclaimer, the term of this patent is extended or adjusted under 35 U.S.C. 154(b) by 0 days.

(21) Appl. No.: 11/141,424

(22) Filed: Jun. 1, 2005

(65) Prior Publication Data

US 2006/0132335 A1    Jun. 22, 2006

(30) Foreign Application Priority Data

Dec. 20, 2004    (JP)    ............... 2004-367741

(51) Int. Cl.
*H03M 5/00*    (2006.01)
(52) U.S. Cl. .......................... 341/58; 341/50
(58) Field of Classification Search ............ 341/50–61, 341/101–104
See application file for complete search history.

(56) References Cited

U.S. PATENT DOCUMENTS

| | | | |
|---|---|---|---|
| 4,371,928 A | 2/1983 | Barlow et al. | |
| 4,486,739 A | 12/1984 | Franaszek et al. | |
| 4,573,034 A | 2/1986 | Immink | |
| 4,924,463 A | 5/1990 | Thomas et al. | |
| 5,025,256 A | 6/1991 | Stevens | |
| 5,327,127 A | 7/1994 | May et al. | |
| 5,387,911 A * | 2/1995 | Gleichert et al. | ............. 341/58 |
| 5,608,757 A | 3/1997 | Smith et al. | |
| 5,612,694 A * | 3/1997 | Jedwab et al. | ................ 341/58 |
| 5,692,021 A | 11/1997 | Walker | |
| 5,805,087 A | 9/1998 | Walker | |
| 5,974,464 A * | 10/1999 | Shin et al. | .................... 341/58 |
| 6,265,994 B1 | 7/2001 | Kahlman et al. | |
| 6,304,933 B1 | 10/2001 | Craft | |
| 6,522,271 B2 * | 2/2003 | Calvignac et al. | ......... 341/102 |

(Continued)

FOREIGN PATENT DOCUMENTS

JP    A 9-507978    8/1997

OTHER PUBLICATIONS

L. Tallini et al., "Balanced Codes with Parallel Encoding and Decoding", *IEEE Transactions on Computers*, vol. 48, No. 8, Aug. 1999, pp. 794-814.

(Continued)

*Primary Examiner*—Lam T. Mai
(74) *Attorney, Agent, or Firm*—Oliff & Berridge, PLC

(57) ABSTRACT

In a data transmission system, a transmitter encodes n-bit transmit data into m-bit code (2n>m>n), and simultaneously transmits the encoded m-bit code via m signal lines. A receiver receives the m-bit code transmitted from the transmitter via the m signal lines, and decodes the received m-bit code into an n-bit data thereby obtaining received data. In the transmitter, the n-bit transmit data is encoded into an m-bit code in accordance with predefined one-to-one correspondence between $2^n$ codes with a width of n bits and $2^n$ codes with a width of m bits each including equal or similar number of "1"s and "0"s selected from $2^m$ codes with the width of m bits, and amplitude levels of transmitted signals are adjusted such that the average voltage of the m signal lines is maintained constant.

24 Claims, 7 Drawing Sheets

U.S. PATENT DOCUMENTS

| | | |
|---|---|---|
| 6,661,355 B2 | 12/2003 | Cornius et al. |
| 6,700,510 B1 * | 3/2004 | Kryzak et al. ................ 341/58 |
| 6,734,811 B1 | 5/2004 | Cornelius |
| 6,763,477 B1 | 7/2004 | McGee |
| 6,803,820 B1 | 10/2004 | Muljono |
| 6,804,304 B1 | 10/2004 | Chan |
| 6,844,833 B2 | 1/2005 | Cornelius et al. |
| 6,876,315 B1 | 4/2005 | Widmer |
| 6,956,852 B1 * | 10/2005 | Bechtolsheim et al. ..... 370/389 |
| 6,977,599 B2 * | 12/2005 | Widmer ....................... 341/59 |
| 2001/0019560 A1 * | 9/2001 | Yamashita .................. 370/472 |
| 2003/0237038 A1 * | 12/2003 | Cole et al. ................... 714/755 |
| 2003/0237041 A1 * | 12/2003 | Cole et al. ................... 714/776 |

OTHER PUBLICATIONS

L. Tallini et al., "Design of Balanced and Constant Weight Codes for VLSI Systems", *IEEE Transactions on Computers*, vol. 47, No. 5, May 1998, pp. 556-572.

* cited by examiner

PARALLEL DATA TRANSMISSION METHOD AND PARALLEL DATA TRANSMISSION SYSTEM

BACKGROUND

The present invention relates to a data transmission method and a data transmission system capable of encoding data with a width of n bits into data with a width of m bits (2n>m>n) and transmitting the resultant data with the width of m bits via m signal lines at a high transmission rate.

It is known to use a differential signal to transmit data without generating radiation noise and without encountering a significant problem associated with common-mode noise.

For example, National Publication of Translated Version No. 9-507978 discloses a high-speed transport system including a differential transmitter of the non-coding type for transmitting a differential signal, a differential receiver for receiving a differential signal, a balanced channel for transmitting the differential signal from the differential transmitter to the differential receiver, and an equalizer for reducing the timing jitter of the differential signal transmitted via the balanced channel.

Referring to a diagram shown in FIG. 7, a conventional parallel data transmission method using a differential signal is described.

In FIG. 7, a data transmission system 30 transmits data with a width of, for example, four bits from a transmitter 32 to a receiver 34 via an eight signal lines (four pairs of signal lines). The transmitter 32 includes four differential drivers 36, each of which transmits one bit of data with the width of four bits, in the form of a differential signal expressed as a potential difference between two signal lines. The receiver 34 includes four differential receiver units 38, each of which receives the differential signal transmitted from a corresponding differential driver, and acquires data from the differential signal expressed as the potential difference between a pair of signal lines.

Transmission of data using differential signals in the above-described manner allows a reduction in radiation noise and a reduction in an influence of common-mode noise.

However, in the conventional differential transmission method, one bit is transmitted using two signal lines, and thus a large number of signal lines are needed to transmit parallel data. This problem is serious in particular when the parallel data has a large bit width.

The number of driver circuits that drive respective pairs of signal lines increases with increasing width of a bus. In transmission of data via a bus with a large width, a great variation can occur in the total value of currents flowing through respective signal lines at transition of data, even if data is transmitted using the differential transmission method. When data is transmitted at a high frequency via a bus, cross coupling between signal lines, fluctuations in the power supply voltage or the ground voltage, electromagnetic radiation due to spike noise, etc. can occur at high-to-low transitions or at low-to-high transitions of data transmitted via the signal line pairs. This problem can occur regardless of the type or the location of the bus, that is, the problem can occur for any bus such as a bus extending on an IC (Integrated Circuit) chip, a bus extending between a chip and another chip on a printed circuit board, or a bus extending between a transmitting device and a receiving device.

SUMMARY

In view of the above, various exemplary embodiments provide a data transmission method and a data transmission system capable of transmitting data at a high transmission rate via a small number of signal lines. Also, various exemplary embodiments provide a data transmission method and a data transmission system capable of transmitting data at a high transmission rate without encountering a significant problem associated with cross coupling between signal lines, fluctuations in the power supply voltage or the ground voltage, electromagnetic radiation due to spike noise, and the like.

To achieve the above objects, various exemplary embodiments provide a data transmission method including the steps of, at a transmitting end, encoding data with a width of n bits (n is an integer equal to or greater than 2) into data with a width of m bits in accordance with predefined one-to-one correspondence between $2^n$ codes with a width of n bits and $2^n$ codes with a width of m bits including equal or similar number of "1"s and "0"s selected from $2^m$ codes with a width of m bits (2n>m>n), transmitting the encoded m-bit width data via m signal lines, and at a receiving end, decoding the m-bit width data into an n-bit width data thereby obtaining received data.

When m is an even number, it may be desirable that the number of "1"s and the number of "0"s included in each m-bit width code are equal to each other. On the other hand, when m is an odd number, it may be desirable that the number of "1"s and the number of "0"s included in each m-bit width code are different from each other by 1.

When the number of "1"s and the number of "0"s are not equal to each other, the amplitude level of the transmitted signal may be adjusted such that the average voltage of the m signal lines is maintained constant.

The n-bit width data to be transmitted may be divided into a plurality of parts, and each part may be separately encoded in the above-described manner.

Various exemplary embodiments also provide a data transmission method, including the steps, performed at a transmitting end, of defining a null code by an arbitrary one of codes with a width of m bits including equal or similar numbers of "1"s and "0"s, which are not selected as data codes corresponding to the respective $2^n$ codes, and, when there is no change in the n-bit transmit data over a period equal to or greater than two transfer clocks, alternately transmitting the encoded m-bit data code corresponding to the n-bit transmit data and the null code, and also including the steps, performed at a receiving end, of reproducing a clock signal by detecting a transition of received m-bit data, and, when the received m-bit data is a data code, holding n-bit data produced by decoding the data code in synchronization with the reproduced clock signal and outputting the held n-bit data as received n-bit data, but when the received m-bit code is the null code, outputting n-bit data held in synchronization with a previous reproduced clock signal as received n-bit data.

Various exemplary embodiments also provide a data transmission system including a transmitter and a receiver, wherein the transmitter encodes data with a width of n bits into data with a width of m bits in accordance with predefined one-to-one correspondence between $2^n$ codes with a width of n bits and $2^n$ codes with a width of m bits including equal or similar number of "1"s and "0"s selected from $2^m$ codes with a width of m bits (2n>m>n), and transmits the encoded data via m signal lines, and the receiver receives the m-bit data transmitted from the transmitter via the m signal lines, and decodes the received m-bit data into n-bit data identical to the original n-bit data thereby obtaining received data. When m is an even number, it may be desirable that the number of "1"s and the number of "0"s included in each m-bit width code are equal to each other. On the other hand, when m is an odd number, it may be desirable that the number of "1"s and the number of "0"s included in each m-bit width code are different from each other by 1.

When the number of "1"s and the number of "0"s are not equal to each other, the transmitter may adjust the amplitude level of the signal to be transmitted such that the average voltage of the m signal lines is maintained constant.

A clock signal that defines a data transmission rate may be transmitted together with the encoded m-bit width code via (m+1) signal lines.

The n-bit width data to be transmitted may be divided into a plurality of parts, and each part may be separately encoded in the above-described manner.

The receiver may determine whether each bit of the received m-bit data is "1" or "0", based on the difference between the voltage of each signal line and the average voltage of the m signal lines or based on the difference between the voltage of each signal line and the average voltage of the remaining (m−1) signal lines, and the receiver decodes the detected m-bit width data into n-bit width data identical to the n-bit transmit data thereby obtaining received data.

The transmitter may define a null code by an arbitrary one of codes with a width of m bits including equal or similar numbers of "1"s and "0"s, which are not selected as data codes corresponding to the respective $2^n$ codes, and, when there is no change in the n-bit transmit data over a period equal to or greater than two transfer clocks, the transmitter may alternately transmit the encoded m-bit data code corresponding to the n-bit transmit data and the null code.

The receiver may reproduce a clock signal by detecting a transition of the received m-bit data, and, when the received m-bit data is a data code, the receiver may hold n-bit data produced by decoding the data code in synchronization with the reproduced clock signal and may output the held n-bit data as received n-bit data, but when the received m-bit data is the null code, the receiver may output n-bit data held in synchronization with a previous reproduced clock signal as received n-bit data.

As described above, in the data transmission method and the data transmission system according to various exemplary embodiments, because n-bit transmit data is encoded into m-bit (2n>m>n) data and the encoded m-bit data is transmitted from the transmitter to the receiver via m signal lines, and the m-bit data is received and decoded into original n-bit data by the receiver, it is possible to transmit data via a lesser number of signal lines than needed in the conventional differential technique. Furthermore, because the average voltage of the m signal lines is maintained constant, it is possible to reduce radiation noise by disposing the m signal lines close to each other. In the receiver, the signal may be determined by the differential method, and thus it may be possible to correctly determine the signal level without being influenced by external common-mode noise.

The receiver can extract the transfer clock signal from received data, and thus it is not necessary for the transmitter to transmit the clock signal via an additional signal line. When there is no change in transmit data, the null code may be transmitted so that the receiver can correctly extract the clock signal.

In the case in which data to be transmitted has a large bit width, the transmit data may be divided into a plurality of parts, and each part may be separately dealt with. This makes it possible to deal with data with a greater bit width without having to use more complicated circuits and without causing an increase in the encoding/decoding time.

DETAILED DESCRIPTION OF EMBODIMENTS

The exemplary data transmission method and the exemplary data transmission system are described in further detail below with reference to preferred embodiments in conjunction with the accompanying drawings.

Figure 1:
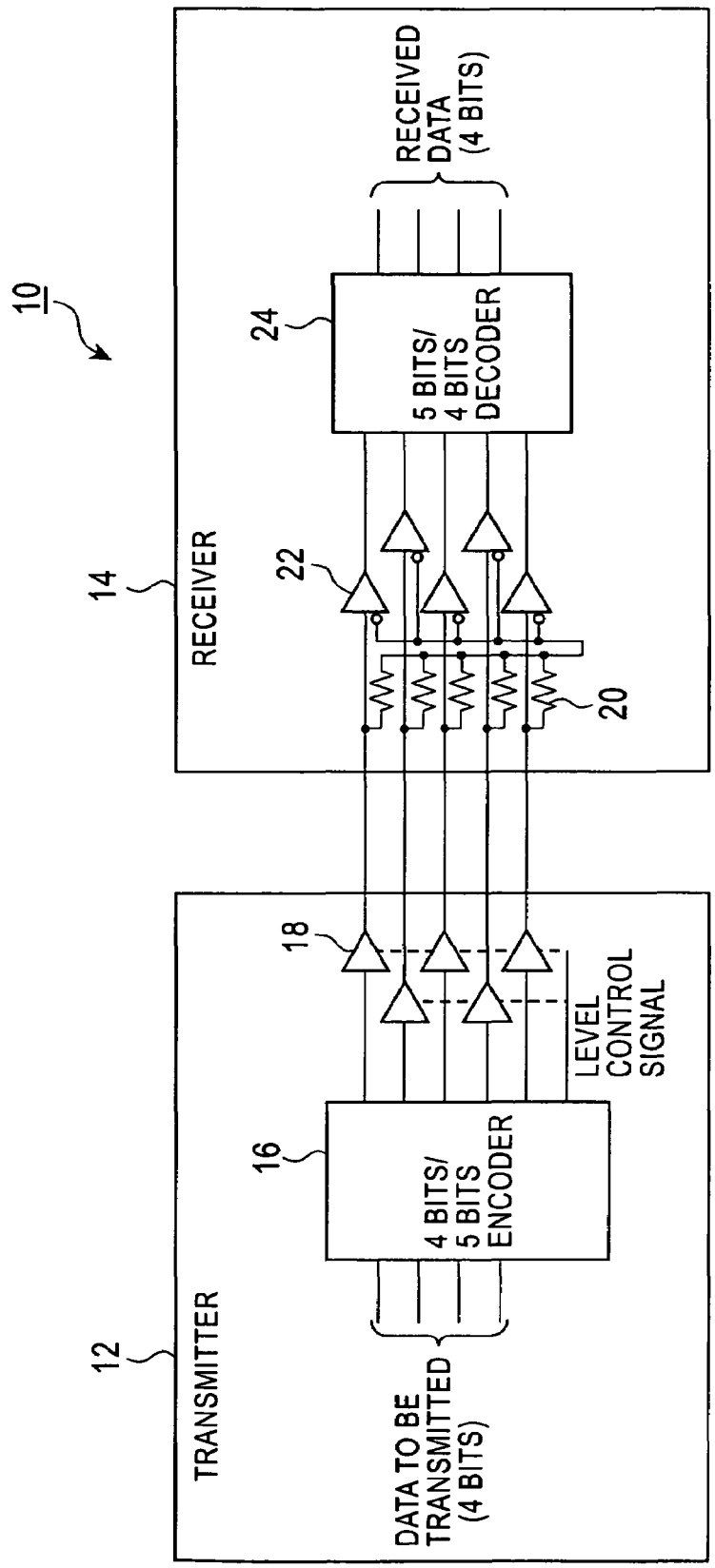
FIG. 1 is a diagram of a data transmission system according to a first embodiment of the present invention.

FIG. 1 is a diagram of a data transmission system according to a first embodiment of the present invention. As shown in FIG. 1, the data transmission system 10 includes a transmitter 12 and a receiver 14.

The transmitter 12 includes a 4 bits to 5 bits encoder 16 (hereinafter referred to simplify as the encoder 16) and five output drivers 18. The transmitter 12 encodes data with a width of 4 bits to be transmitted into data with a width of 5 bits, controls the output amplitude level of the converted data, and transmits the converted data via five signal lines at the same time at a high transmission rate.

The encoder 16 encodes the 4-bit data to be transmitted to 5-bit data.

That is, the 4-bit data to be transmitted is input to the encoder 16, and the encoder 16 puts encoded 5-bit data.

The encoder 16 encodes a given 4-bit code into a 5-bit code in accordance with predefined one-to-one correspondence between 16 ($=2^4$) 4-bit codes and 5-bit codes including similar numbers of "1"s and "0"s selected from 32 ($=2^5$) 5-bit codes. The correspondence between 4-bit codes and 5-bit codes may be defined arbitrarily as long as one-to-one correspondence is defined. In the present exemplary embodiment, a total of 16 5-bit codes are arbitrarily selected from a total of 10 5-bit codes each consisting of three "1"s and "0"s and a total of 10 5-bit codes each consisting of two "1"s and three "0"s, that is, from a total of 20 5-bit codes, and the selected 16 5-bit codes are assigned, arbitrarily but in a one-to-one fashion, to 16 4-bit codes. Table 1 shows an example of such correspondence according to the present exemplary embodiment.

TABLE 1

| 4-bit code | 5-bit code | Level control signal |
|---|---|---|
| 0000 | 11100 | 0 |
| 0001 | 00101 | 1 |
| 0010 | 00110 | 1 |
| 0011 | 00011 | 1 |

TABLE 1-continued

| 4-bit code | 5-bit code | Level control signal |
|---|---|---|
| 0100 | 01100 | 1 |
| 0101 | 01101 | 0 |
| 0110 | 01110 | 0 |
| 0111 | 10011 | 0 |
| 1000 | 10100 | 1 |
| 1001 | 10101 | 0 |
| 1010 | 10110 | 0 |
| 1011 | 01011 | 0 |
| 1100 | 11000 | 1 |
| 1101 | 11001 | 0 |
| 1110 | 11010 | 0 |
| 1111 | 00111 | 0 |

As shown in Table 1, 4-bit data to be transmitted is represented by one of 16 4-bit codes from "0000" to "1111", and each of these 16 4-bit codes is assigned, arbitrarily but in a one-to-one fashion, one of 16 5-bit codes selected from the total of 20 5-bit codes described above. Table 1 shows an example of the correspondence between 4-bit codes and 5-bit codes, but the correspondence is not limited to that shown in Table 1.

The encoder 16 also outputs a level control signal by which to control the amplitude level of signals output from the output drivers 18. In the present exemplary embodiment, the level control signal controls the amplitude level of the signals output from the respective output drivers 18 such that the average value of voltages of signals transmitted via five signal lines is maintained constant regardless of whether three signal lines are at the high level or two signal lines are at the high level.

Each output driver 18 may output a signal with a high voltage level or a low voltage level depending on input data. In the present exemplary embodiment, each output driver 18 outputs a signal with the high voltage level when input data is "1" and a signal with the low voltage level when input data is "0". Alternatively, each output driver 18 may output a signal with the high voltage level when input data is "0" and a signal with the low voltage level when input data is "1". One component of the data output from the encoder 16 is input to the input terminal of each output driver 18, and the level control signal is input to the control terminal of each output driver 18.

As shown in Table 1, when the level control signal is "0", that is, when three signal lines are at the high voltage level, each output driver 18, to which "1" is input, outputs a signal with a voltage equal to (Va+2Vu) and each output driver 18, to which "0" is input, outputs a signal with a voltage equal to (Va−3Vu). On the other hand, when the level control signal is "1", that is, when two signal lines are at the high voltage level, each output driver 18, to which "1" is input, outputs a signal with a voltage equal to (Va+3Vu) and each output driver 18, to which "0" is input, outputs a signal with a voltage equal to (Va−2Vu). In the expressions described above, Va denotes the average voltage and Vu denotes a unit voltage.

When the level control signal is "0", three signal lines are at the high voltage level, and thus the average value of voltages of the five signal lines is given as (3(Va+2Vu)+2(Va−3Vu))/5=Va. In the case in which the level control signal is "1", two signal lines are at the high voltage level, and thus the average value of voltages of the five signal lines is given as (2(Va+3Vu)+3(Va−2Vu))/5=Va. Thus, the average value of the voltages of the five signal lines is maintained at a constant value equal to Va. The polarity of the level control signal is not limited to that described above, but the level control signal may be set to "1" when three signal lines are at the high voltage level, and to "0" when two signal lines are at the high voltage level.

As described above, 4-bit data to be transmitted is encoded into 5-bit data in accordance with the predefined one-to-one correspondence between 16 4-bit code and 16 5-bit codes including similar numbers of "1"s and "0"s (in the present embodiment, the numbers of "1"s and "0"s are different by 1) selected from 20 5-bit codes, and the encoded 5-bit data is transmitted via the five signal lines while controlling the amplitude voltage levels of the signals output from the five output drivers 18 such that the average value of the amplitude voltage levels is maintained constant, thereby allowing the digital data to be transmitted via a less number of signal lines at a high transmission rate without encountering a problem associated with noise.

There is no particular restriction on the bit width n of data to be transmitted. The bit width m of coded data may be set in the range 2n>m>n. In the present exemplary embodiment, when the bit width m of coded data is set to be an odd number, voltages of signals output from the output drivers are controlled by the level control signal.

When the bit width m of coded data is set to be an even number, if the encoding is performed such that one-half of the total bits of the encoded data are "1" and the remaining bits are "0", the control of the amplitude levels of signals output from the output drivers 18 by the level control signal is unnecessary.

The receiver 14 receives the 5-bit signals simultaneously transmitted via the five signal lines from the transmitter 12, and decodes the received signals into 4-bit data identical to the original transmitted data. The receiver 14 includes an average voltage detector 20, differential receiver units 22 for receiving one of 5-bit signals, and a 5 bits to 4 bits decoder 24 (hereinafter referred to simply as the decoder 24).

The average voltage detector 20 detects the average voltage of 5-bit signals. In the example shown in FIG. 1, the average voltage detector 20 is composed of five resistors corresponding to the respective five signal lines. One end of each of the five resistors is connected to one of the five signal lines, and the other ends of the respective resistors are connected in common to inverting input terminals of the differential receiver units 22.

Each differential receiver unit 22 determines whether the received signal is "1" or "0", based on the difference between the voltage of the signal line and the average voltage, detected by the average voltage detector 20, of the five signal lines. As described above, the average voltage of the five signal lines is always equal to Va. Therefore, when the voltage of a signal line is equal to Va+2Vu or Va+3Vu, the voltage difference becomes positive and the signal of that signal line is determined as "1". On the other hand, when the voltage of a signal line is equal to Va−3Vu or Va−2Vu, the voltage difference becomes negative and the signal of that signal line is determined as "0".

The method of determining the signal level is not limited to the above-described method based on the comparison between the voltage of each signal line and the average voltage of the five signal lines. For example, the signal level of a signal line may be determined by comparing the voltage of the signal line with the average voltage of the other four signal lines.

The decoder 24 decodes the 5-bit data supplied from the differential receiver units 22 into 4-bit data. More specifically, the data output from the differential receiver units 22 is input to the decoder 24, and 4-bit decoded data is output from the decoder 24. The decoder 24 performs decoding in accordance with predefined correspondence shown in Table 1 so as to obtain received data identical to the transmitted data.

In the data transmission system 10, as described above, the transmitter 12 encodes 4-bit data to be transmitted into 5-bit data and transmits the resultant encoded 5-bit data, which is received by the receiver 14. The receiver 14 decodes received 5-bit data into 4-bit data identical to the original transmitted data. This allows the data to be transmitted via a less number of signals lines than needed in the conventional differential transmission system. Besides, because the average voltage of the five signal lines is maintained at a constant voltage equal to Va, it is possible to reduce the radiation noise by disposing the five signal lines close to each other. Furthermore, in the receiver 14, because the signal level of each received signal is determined by the differential method, it is possible to correctly determine the signal level without being influenced by external common-mode noise.

To facilitate understanding, the encoding is performed from 4-bit data to be transmitted into 5-bit data. However, in various exemplary embodiments, the bit width of original data and the bit width of encoded data are not limited to those employed in the present exemplary embodiment. That is, in the transmitter, data with a width of n bits may be encoded into data with a width of m bits in accordance with predefined one-to-one correspondence between $2^n$ codes with the width of n bits and $2^n$ codes with the width of m bits, each consisting of equal or similar number of "1"s and "0"s, selected from $2^m$ codes with the width of m bits (where 2n>m>n), and the encoded data with the width of m bits may be transmitted via m signal lines. In the receiver, the received m-bit width data may be decoded into n-bit width data identical to the original data. When n is an integer equal to or greater than 2, the above-described advantages of the present invention are obtained.

When m is an even number, it is desirable that the number of "1"s and the number of "0"s included in each m-bit width code are equal to each other. On the other hand, when m is an odd number, it is desirable that the number of "1"s and the number of "0"s included in each m-bit width code are different from each other by 1.

Second Embodiment

In the data transmission system 10, in some cases, 4-bit width data decoded by the receiver 14 from 5-bit width data are sequentially latched by a register or the like in synchronization with a clock signal extracted by a clock recovery circuit, from the 5-bit width data transmitted from the transmitter 12. In such a data transmission system 10, if data transmitted from the transmitter 12 to the receiver 14 changes data by data, a signal line for transmitting the clock signal is unnecessary.

However, in the case in which there can be no change in the data transmitted from the transmitter 12 to the receiver 14 for some period, it is impossible to extract a clock signal from the transmitted 5-bit width data when there is no change in the transmitted data over a period equal to or longer than two clocks. In this case, a signal line for transmitting the clock signal is needed in addition to the signal lines for transmitting data, as in a data transmission system 40 shown in FIG. 2. The present exemplary embodiment may also be applied to such a data transmission system.

Figure 2:
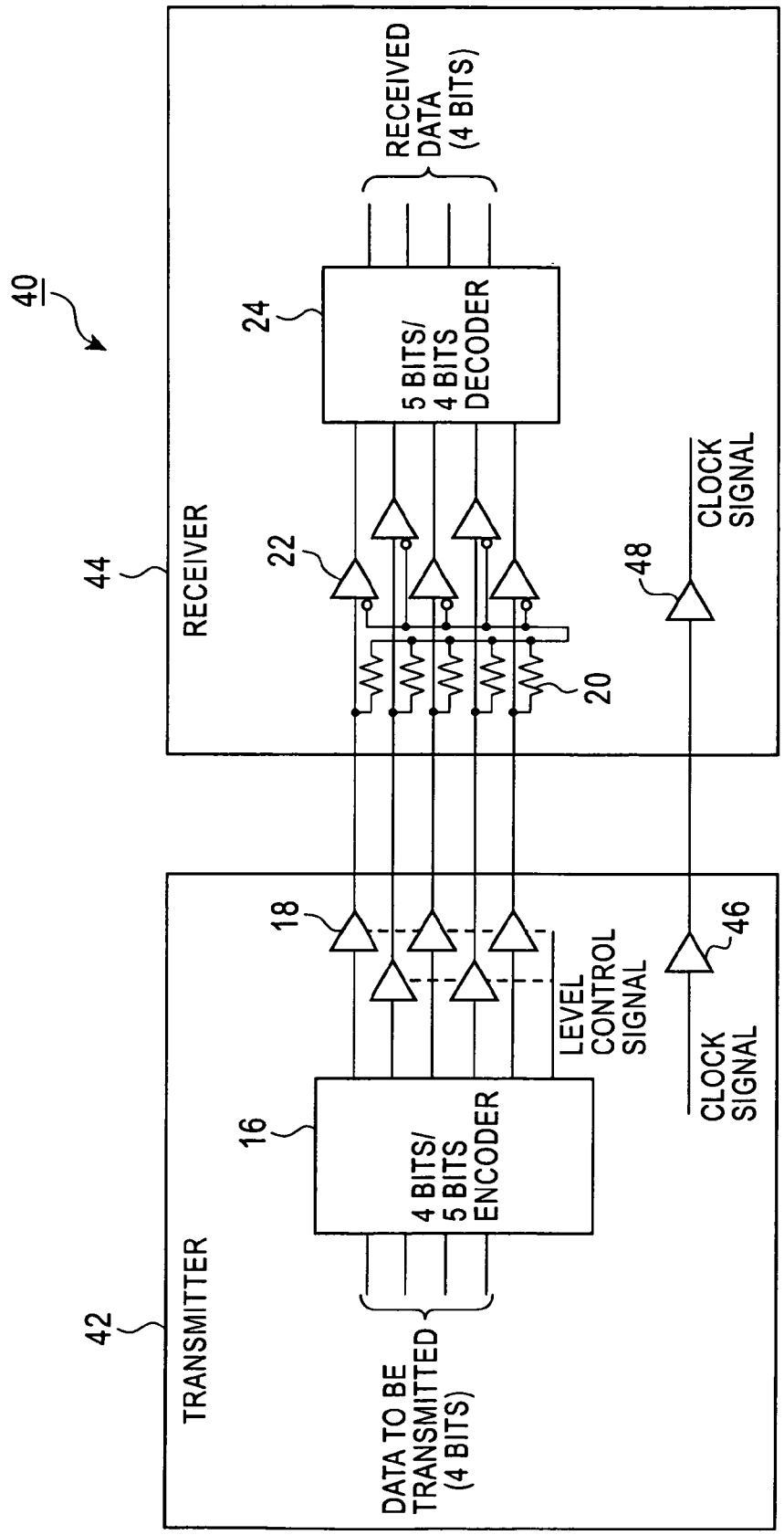
FIG. 2 is a diagram of a data transmission system according to a second embodiment of the present invention.

The data transmission system 40 shown in FIG. 2 is similar to the data transmission system 10 shown in FIG. 1 except that the data transmission system 40 additionally includes a clock driver 46 disposed in a transmitter 42 corresponding to the transmitter 12 and a clock receiver 48 disposed in a receiver 44 corresponding to the receiver 14, wherein the output terminal of the clock driver 46 and the input terminal of the clock receiver 48 are connected to each other via a clock signal line. Thus, the data transmission system 40 includes signal lines whose number is greater by one than the signal lines of the data transmission system 10.

Third Embodiment

Even in the case in which no change occurs in transmitted data for some period, the signal line for transmitting the clock signal can be omitted, if a null code from which to extract a clock signal is transmitted. This allows a reduction in the number of signal lines.

Figure 3:
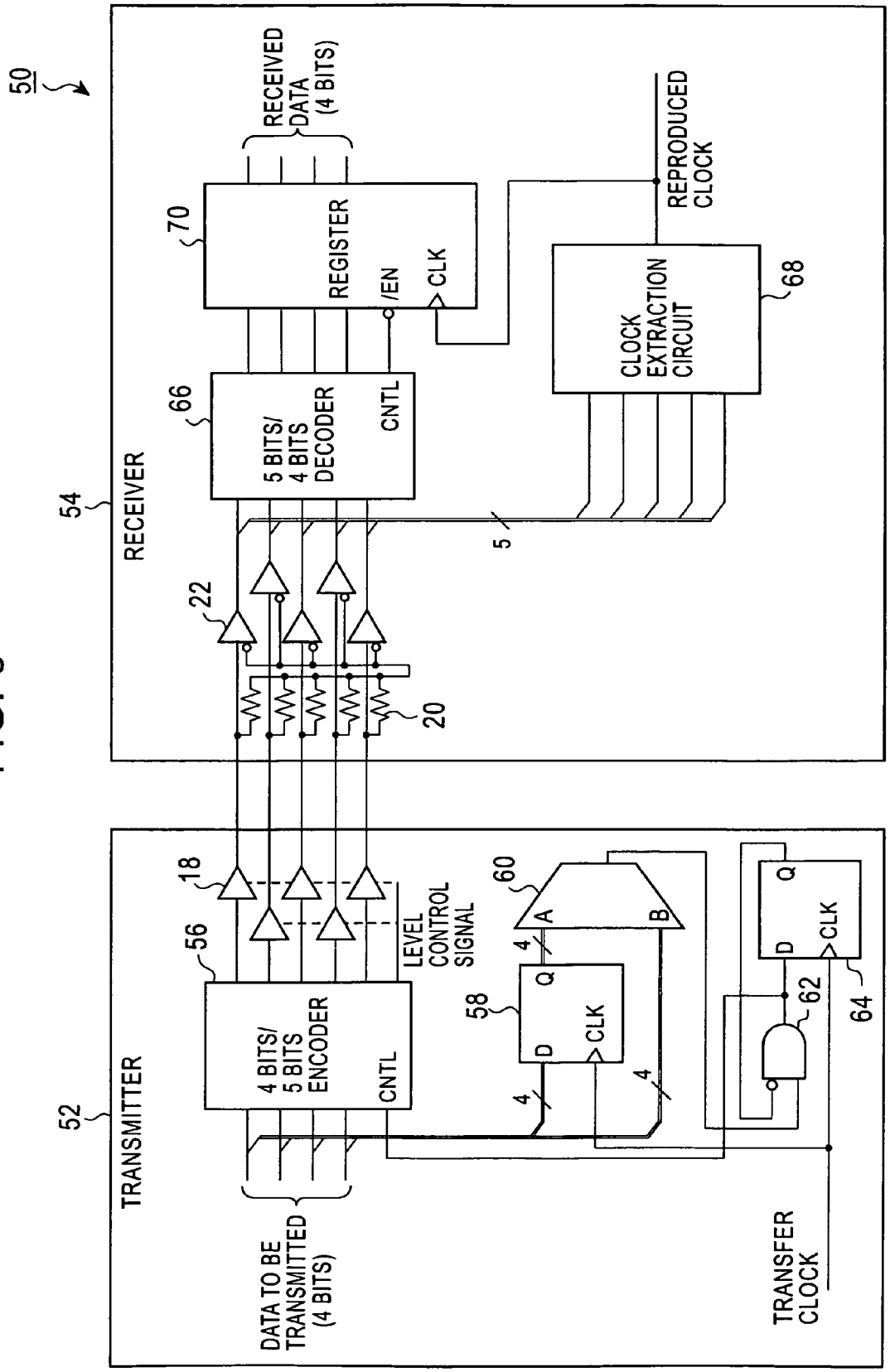
FIG. 3 is a diagram of a data transmission system according to a third embodiment of the present invention.

FIG. 3 shows an exemplary data transmission system 50 including a transmitter 52 and a receiver 54, capable of extracting the clock signal without using the clock signal line. In the data transmission system 50 shown in FIG. 3, similar parts to those in the data transmission system 10 shown in FIG. 1 are denoted by similar reference numerals, a further description thereof is omitted.

The transmitter 52 includes a 4 bits to 5 bits encoder 56 (hereinafter referred to simply as the encoder 56), five output drivers 18, four flip-flops 58 corresponding to respective bits of 4-bit data to be transmitted, a comparator 60, an AND gate 62, and a flip-flop 64.

The encoder 56 encodes 4-bit width data to be transmitted into 5-bit width data and outputs a level control signal by which to control the amplitude level of signals output from the output drivers 18. The encoder 56 is similar to the encoder 16 shown in FIG. 1 except that the encoder 56 includes an input terminal CNTL for receiving a control signal CNTL and that the encoder 56 has a capability of outputting the null code. The control signal CNTL input to the input terminal CNTL of the encoder 56 is supplied from the AND gate 62 as will be described later.

When the control signal CNTL=0, the encoder 56 operates in completely the same manner as the encoder 16, as shown, for example, in Table 2. In Table 2, when the control signal CNTL=0, the correspondence between 4-bit codes and 5-bit codes and the value of the level control signal are exactly the same as those shown in Table 1.

However, when the control signal CNTL=1, as shown in Table 2, the encoder 56 outputs a null code arbitrarily selected from four 5-bit codes which are included in the 20 5-bit codes described above but which are not included in the 16 5-bit codes (data codes) assigned, in the one-to-one fashion, to the respective 16 4-bit codes. In the example shown in Table 2, when the control signal CNTL=1, "10001" is output as the NULL code, and "1" is output as the level control signal. The polarity of the level control signal CNTL is not limited to that described above, but may be determined in an opposite manner.

The flip-flops 58, the comparator 60, the AND gate 62, and the flip-flop 64 are circuits for generating the control signal CNTL.

TABLE 2

| CNTL | 4-bit code | 5-bit code | Level control signal |
|---|---|---|---|
| 0 | 0000 | 11100 | 0 |
| 0 | 0001 | 00101 | 1 |
| 0 | 0010 | 00110 | 1 |
| 0 | 0011 | 00011 | 1 |
| 0 | 0100 | 01100 | 1 |
| 0 | 0101 | 01101 | 0 |
| 0 | 0110 | 01110 | 0 |
| 0 | 0111 | 10011 | 0 |
| 0 | 1000 | 10100 | 1 |
| 0 | 1001 | 10101 | 0 |
| 0 | 1010 | 10110 | 0 |
| 0 | 1011 | 01011 | 0 |
| 0 | 1100 | 11000 | 1 |
| 0 | 1101 | 11001 | 0 |
| 0 | 1110 | 11010 | 0 |
| 0 | 1111 | 00111 | 0 |
| 1 | — | 10001 | 1 |

More specifically, each bit of the 4-bit transmit data is input to a data input terminal D of each of the four flip-flops 58, and a transfer clock signal is input to a clock input terminal CLK of each of the four flip-flops 58. In synchronization with a rising edge of the clock signal, the flip-flops 58 capture new 4-bit transmit data and output, from data output terminals Q.

The 4-bit transmit data captured by the four flip-flops 58 in synchronization with the previous clock signal is input to an input terminal A of the comparator 60. The current 4-bit transmit data is input to an input terminal B of the comparator 60. The comparator 60 compares the previous 4-bit transmit data with the current 4-bit transmit data. If both data are identical to each other (that is, if there is no change), the comparator outputs a high-level signal "1" as the comparison result.

The comparison result output from the comparator 60 is input to one of input terminals of the AND gate 62. The signal output from the data output terminal Q of the flip-flop 64 is input to the other input terminal, that is, the inverting input terminal, of the AND gate 62. When the signal output from the flip-flop 64 is at the high level "1", the AND gate 62 outputs a low-level signal "0" as the control signal CNTL. On the other hand, when the signal output from the flip-flop 64 is at the low level "0", the AND gate 62 outputs a signal equal to the comparison result ("0" or "1") output from the comparator 60 as the control signal CNTL.

The control signal CNTL output from the AND gate 62 is input to the data input terminal D of the flip-flop 64, and the transfer clock signal is input to the clock input terminal CLK of the flip-flop 64. In synchronization with the rising edge of the transfer clock signal, the flip flop 64 captures the control signal CNTL output from the AND gate 62 and outputs the control signal CNTL from the data output terminal Q.

In the case in which the current transmit data is different from the previous transmit data, according to various exemplary embodiments, the comparator 60 outputs a low-level signal "0" as the comparison result. In this case, the AND gate 62 outputs a low-level signal "0" as the control signal CNTL.

Thus, the encoder 56 outputs an encoded 5-bit code corresponding to the 4-bit transmit data, and the encoded 5-bit code is transmitted via the output drivers 18.

On the other hand, when the current transmit data is the same as the previous transmit data, the comparator 60 outputs a high-level signal "1" as the comparison result. In this case, only when the level of the previous control signal CNTL is not high, the AND gate 62 outputs a high-level signal as the control signal CNTL, but the AND gate 62 outputs a low-level signal if the level of the previous control signal CNTL is high.

As such, when the present transmit data is the same as the previous transmit data, and when the null code was not output from the encoder 56 as the previous transmit data, the encoder 56 outputs the null code, which is transmitted via the output drivers 18.

When the present transmit data is the same as the previous transmit data, and when the null code was output from the encoder 56 as the previous transmit data, the encoder 56 outputs an encoded 5-bit code corresponding to the present transmit data, which is transmitted via the output drivers 18.

If the NULL code is successively output twice, no change occurs in the transmitted data. To avoid the transmission of successive two null codes, if the current transmit data is the same as the previous transmit data and if the previous transmit data was the null code, the null code is not output, but the current transmit data is encoded and the resultant encoded data is output.

Thus, it is ensured that the voltage level changes at least at one of the five signal lines. This makes it possible for the receiver 54 to extract a clock signal from the 5-bit signal received from the transmitter 52.

The receiver 54 includes an average voltage detector 20, five differential receiver units 22, a 5 bits to 4 bits decoder 66 (hereinafter referred to simply as the decoder 66), a clock extraction circuit 68, and a register 70.

The decoder 66 decodes the 5-bit data supplied from the five differential receiver units 22 into 4-bit data. The decoder 66 is similar to the decoder 24 shown in FIG. 1 except that the decoder 66 additionally has an output terminal from which to output the control signal CNTL. In the present embodiment, the decoding is performed by the decoder 66 in accordance with the correspondence shown in Table 2 so as to obtain data identical to the original transmit data.

When the 5-bit data output from the differential receiver units 22 is the null code, the decoder 66 outputs a high-level signal as the control signal CNTL. However, when the 5-bit data output from the differential receiver units 22 is not the null code, the decoder 66 outputs a low-level signal as the control signal CNTL. The 4-bit data output from the decoder 66 is input to the data input terminals of the register 70, and the control signal CNTL output from the decoder 66 is input to an enable terminal/EN of the register 70.

The 5-bit data output from the differential receiver units 22 is also supplied to the clock extraction circuit 68. The clock extraction circuit 68 extracts a clock signal from the 5-bit data received from the differential receiver units 22. The extracted clock signal output from the clock extraction circuit 68 is input to a clock input terminal CLK of the register 70.

Figure 4:
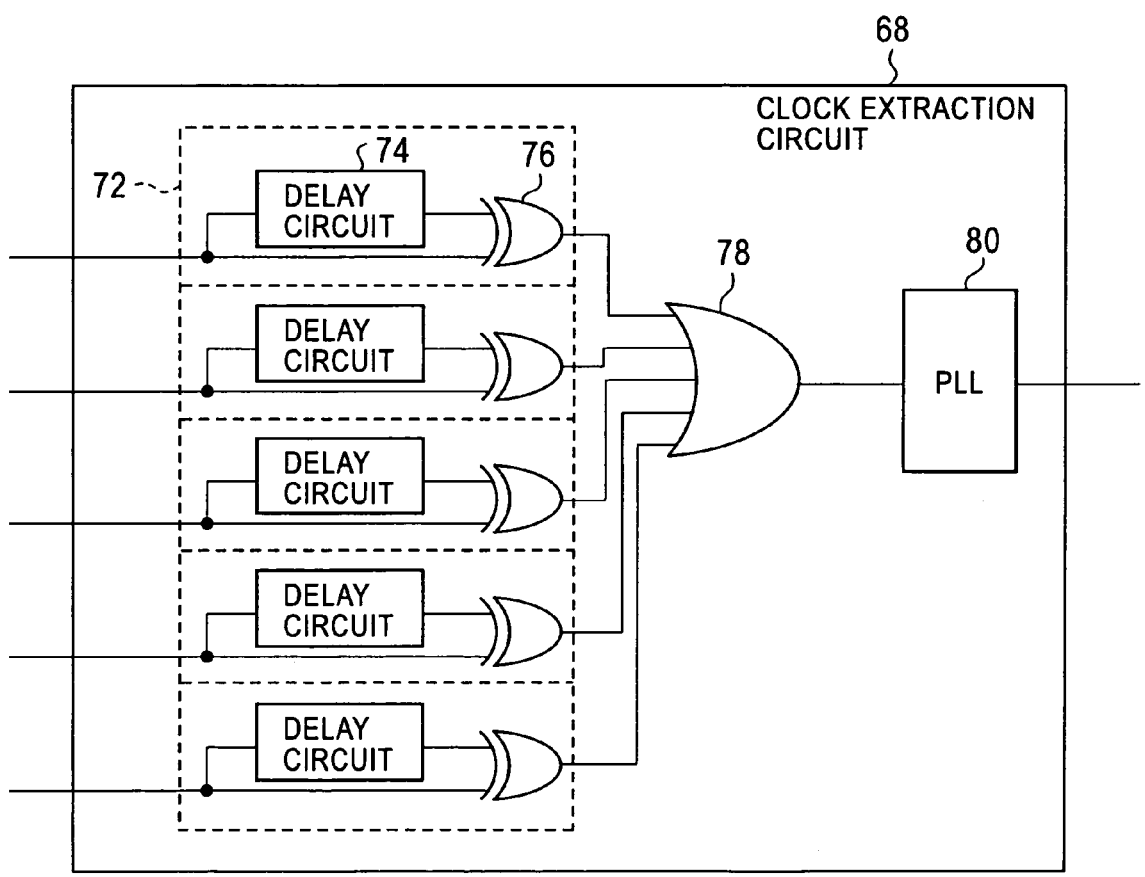
FIG. 4 is a diagram showing an example of a clock extractor in a receiver shown in FIG. 3.

In the present embodiment, as shown in FIG. 4, the clock extraction circuit 68 includes five transition detectors 72 for detecting transitions of the respective bits of the 5-bit data supplied from the differential receiver units 22, an OR gate 78, and a PLL (phase-locked loop) circuit 80.

Each transition detector 72 includes a delay circuit 74 and an EXOR gate 76. A signal output from one of the differential receiver units 22 is directly input to one of input terminals of the EXOR gate 76 of each transition detector 72, and the signal is indirectly input to the other input terminal via the delay circuit. Each transition detector 72 detects a high-to-low transition or a low-to-high transition of the signal and outputs a high-level pulse with a width equal to the delay time of the delay circuit 74. The delay time of the delay circuit 74 is set to be shorter than the repetition period of the transfer clock.

In the exemplary clock extraction circuit 68 shown in FIG. 4, transition detectors 72 detect transitions of the respective bits of the data output from the differential receiver units 22. The logical OR of all signals output from the transition detectors 72 is determined by the OR gate 78, and the result is supplied to the PLL circuit 80. In the present embodiment, since a transition occurs at least at one bit of the transmit data, the OR gate 78 outputs a signal at the same repetition period as that of the transfer clock. The PLL circuit 80 generates a reproduced clock signal based on the signal output from the OR gate 78.

When the control signal CNTL is at the low level, that is, when the 5-bit signal transmitted from the transmitter 52 is not the null code, the register 70 captures the 4-bit data supplied from the decoder 66 in synchronization with a rising edge of the reproduced clock signal supplied from the clock extraction circuit 68, and the register 70 holds the captured 4-bit data until the register 70 outputs the captured 4-bit data in synchronization with the rising edge of the following reproduced clock signal. On the other hand, when the control signal CNTL is at the high level, that is, when the 5-bit signal transmitted from the transmitter 52 is the null code, the register 70 does not capture the 4-bit data supplied from the decoder 66 even if the reproduced clock signal rises up to the high level. In this case, the register 70 outputs 4-bit data captured in synchronization with the previous clock signal.

In the exemplary data transmission system 50, as described above, when there is no change in the data transmitted from the transmitter 52 to the receiver 54, the null code is transmitted every two clock signals. Therefore, even in a period in which there is no change in the data, a transition occurs at least at one of transmission signal lines via which the data is transmitted. This ensures that a clock signal can be extracted from the data, and thus a signal line for transmitting the clock signal is not necessary. This allows a reduction in the number of signal lines.

Referring to an exemplary timing chart shown in FIG. 5, the operation of the data transmission system 50 is described in further detail below.

Figure 5:
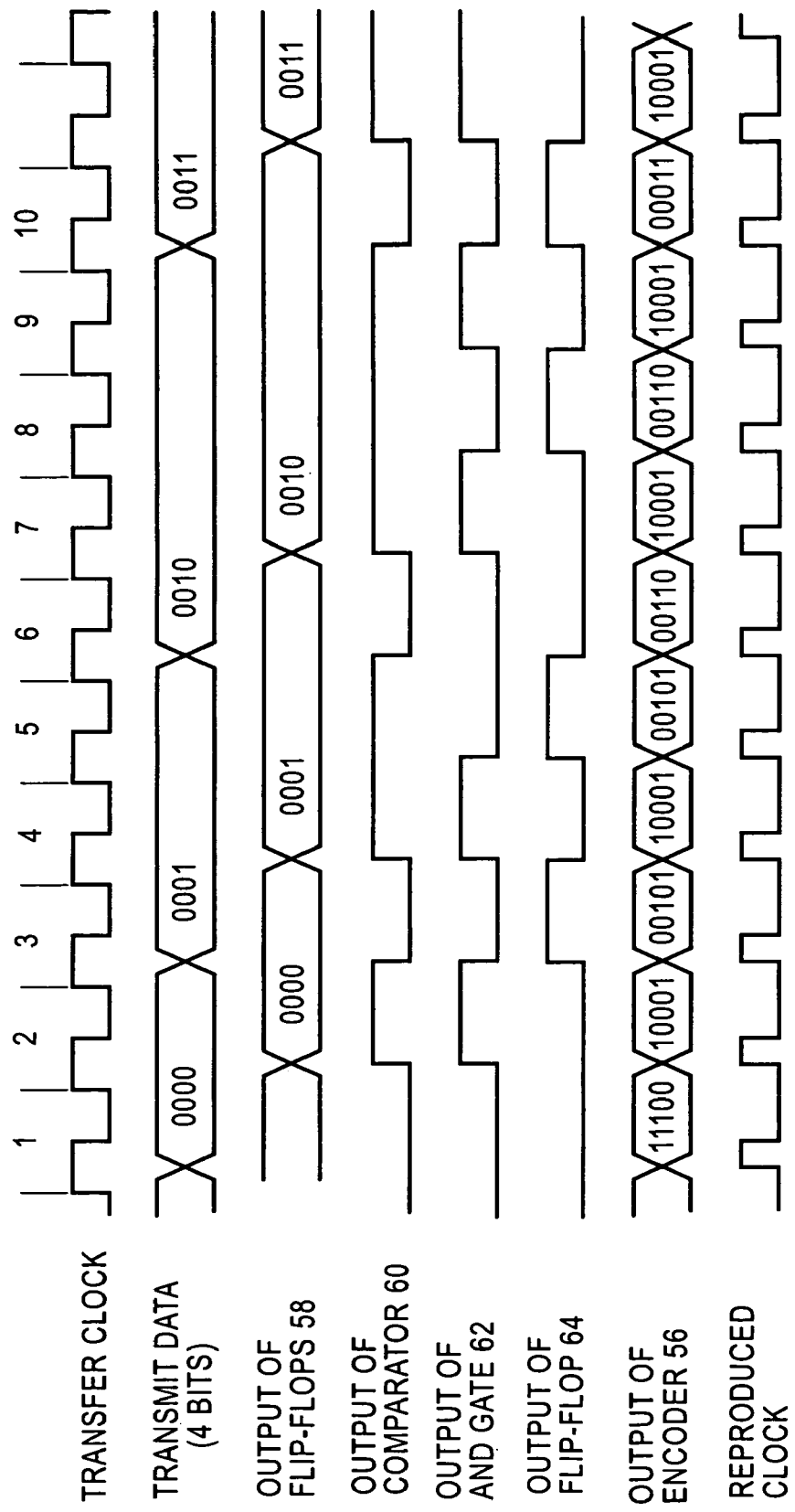
FIG. 5 is a timing chart associated with an operation of a data transmission system shown in FIG. 3.

In the timing chart shown in FIG. 5, 4-bit transmit data has the same value "0001" during a period from a third clock signal to a fifth clock signal. That is, there is no change in the data during this period of three clock signals. The operation during this period is described below. The signal output from the flip-flops 58, that is, the 4-bit transmit data corresponding to the previous clock signal becomes "0000" at the third clock signal and becomes "0001" at the fourth clock signal and maintains it until the end of the sixth clock signal.

At the third clock signal, the transmit data is "0001" and the previous transmit data is "0000", and thus the comparator 60 output a low-level signal as the comparison result. As a result, the AND gate 62 outputs a low-level signal as the control signal CNTL, and the encoder 56 outputs a 5-bit code "00101" corresponding to the transmit data "0001".

At the following fourth clock signal, the transmit data is "0001" and the previous transmit data is also "0001". Thus, the comparator 60 outputs a high-level signal as the comparison result. As a result, the control signal CNTL becomes high, and the encoder 56 outputs "10001" as the null code.

At the following fifth clock signal, in response to the low-to-high transition of the control signal CNTL at the fourth clock signal, the signal output from the flip-flop 64 becomes high. As a result, the control signal CNTL becomes low, and the encoder 56 outputs an encoded 5-bit code "00101" corresponding to the transmit data "0001".

At the sixth clock signal, the transmit data is "0010" and the previous transmit data is "0001". Thus, the comparator 60 outputs a low-level signal as the comparison result. As a result, the control signal CNTL becomes low, and the encoder 56 outputs an encoded 5-bit code "001101" corresponding to the transmit data "0010".

As described above with reference to the exemplary timing chart shown in FIG. 5, at the third to sixth clock signals, the encoder 56 outputs "00101", "10001", "00101", and "00110" and thus a transition always occurs at least at one of five bits of the 5-bit data transmitted from the transmitter 52. This ensures that the receiver 54 can reproduce a clock signal from the received 5-bit data.

Although the exemplary operation has been described above for the period from the third to sixth clock signals in the timing chart shown in FIG. 5, the operation is similar at any clock signal. The structures of the control signal generating circuit shown in FIG. 3, and the structure of the clock extraction circuit 68 shown in FIG. 4 are not limited to those shown in these figures. Circuits having similar functions but configured in other ways may also be used. The levels of the respective signal lines may be inverted as required.

Fourth Embodiment

A data transmission system according to a fourth exemplary embodiment is described below with reference to FIG. 6.

In the first to third exemplary embodiment, to provide a better understanding, the bit width n is assumed to be as small as 4 bits. However, if the bit width n is simply increased, the encoder and the decoder according to any above-described embodiment of the invention will become great in terms of the circuit size, and it will take a longer time for the encoder and the decoder to perform encoding and decoding. In the fourth exemplary embodiment, to avoid such a problem, when the bit width of the transmit data is as large as, for example, 8 bits, 16 bits, 32 bits, 64 bits, or 128 bits, the transmit data is divided into a plurality of parts, and the transmitter and the receiver according to the third embodiment described above are used to deal with the respective divided parts of the data. For example, when the transmit data has a width of 8 bits, the 8-bit transmit data is divided into high-order 4-bit data and low-order 4-bit data, each of the high-order and low-order 4-bit data is dealt with by each transmitter or receiver according to the third embodiment described above. This process may make it possible to deal with data with a greater bit width by using the same simple circuits.

This technique may be applied not only to data with a width of 8 bits, but also to data with a greater bit width such as 16-bit data, 32-bit data, and the like. For example, in the case in which the transmit data has a width of 16 bits, the transmit data is divided into four 4-bit parts, and each part is dealt with according to the third exemplary embodiment described above. When the transmit data has a width of 32 bits, the data is divided into eight 4-bit parts, and each part is dealt with according to the third exemplary embodiment described above.

Figure 6:
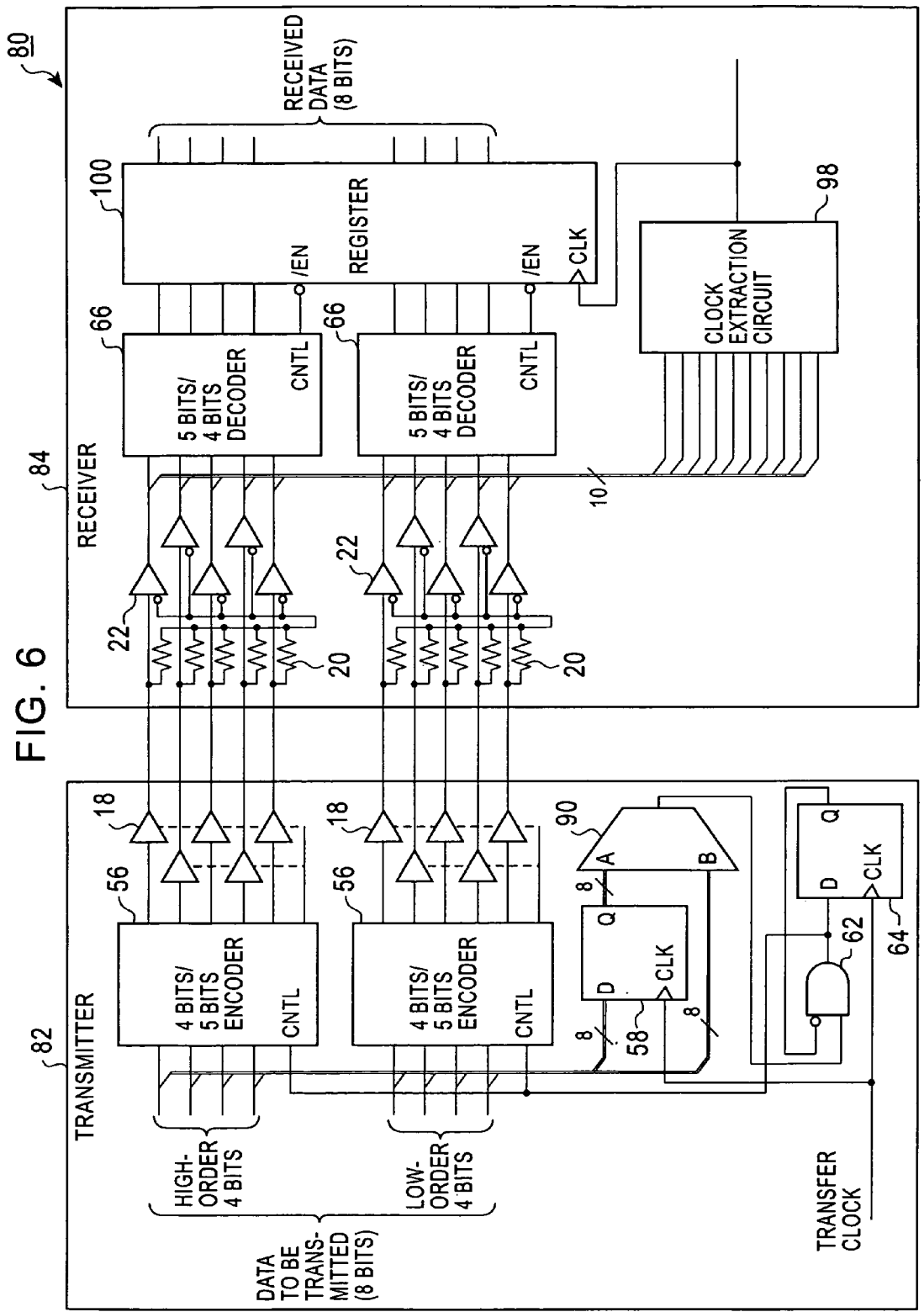
FIG. 6 is a diagram of a data transmission system according to a fourth embodiment of the present invention.
Figure 7:
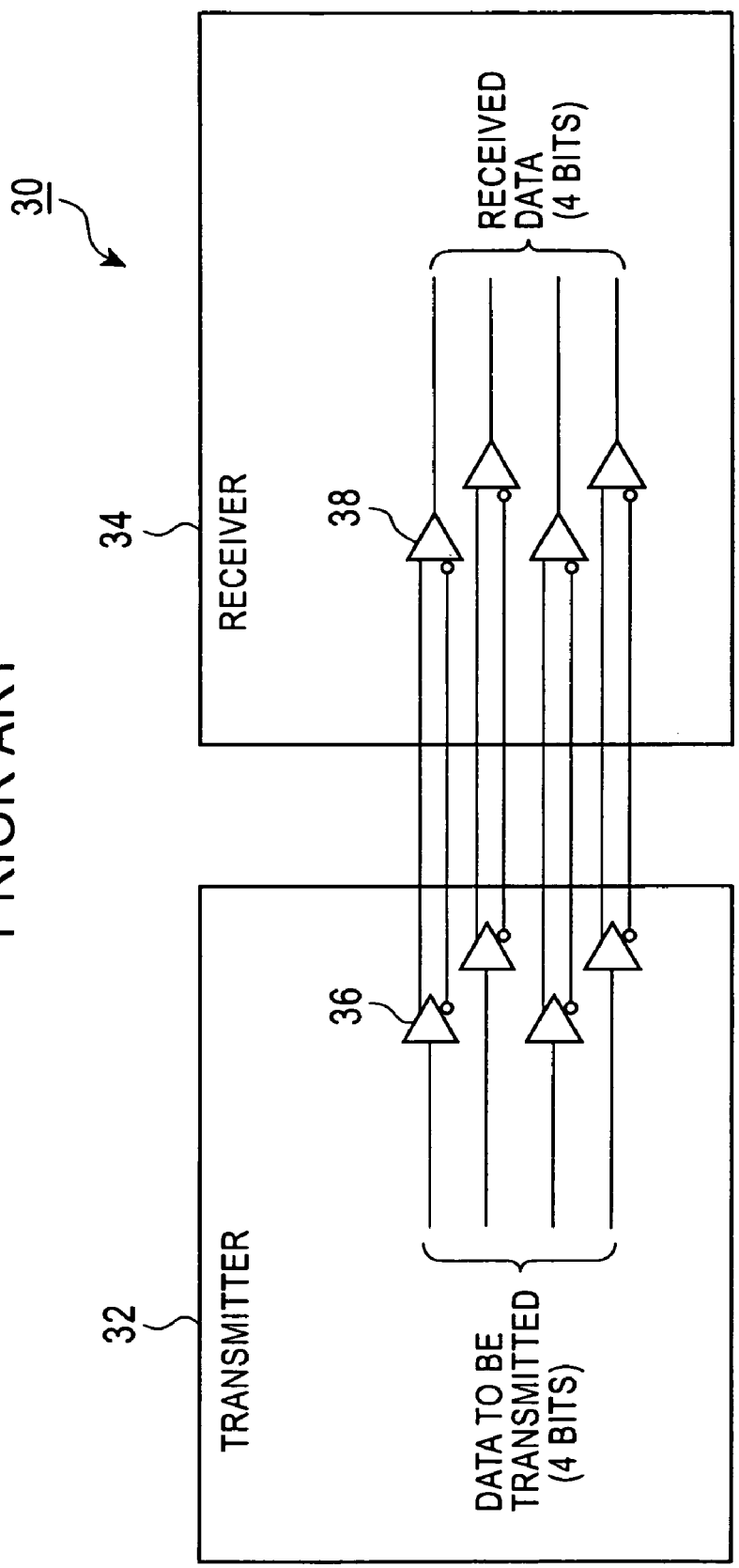
FIG. 7 is a diagram showing a data transmission system using a conventional differential transmission method.

In the exemplary data transmission system 80 shown in FIG. 6, 8-bit transmit data is encoded into 10-bit code and transmitted via ten signal lines.

The data transmission system 80 includes a transmitter 82, a receiver 84, and ten signal lines.

The exemplary transmitter 82 includes two 4 bits to 5 bits encoders 56, ten output drivers 18, eight flip-flops 58 corresponding to respective bits of the 8-bit transmit data, a comparator 90, an AND gate 62, and a flip-flop 64. Similar parts to those in the transmitter 52 shown in FIG. 3 are denoted by similar reference numerals. The transmitter 82 is similar to the transmitter 52 except that 8-bit transmit data is divided into high-order 4-bit data and low-order 4-bit data, which are separately encoded by the two respective encoders 56, and that the bit width of the comparator 90 is expanded from 4 bits to 8 bits. Thus, the transmitter 82 operates in a similar manner to the transmitter 52, and a further description of the operation of the transmitter 82 is omitted.

The receiver 84 is similar to the receiver 54 shown in FIG. 3 except that the receiver 84 includes two 5 bits to 4 bits decoder 66, and the bit width of the clock extraction circuit 98 and that of the register 100 are expanded from 4 bits to 8 bits. Thus, the receiver 84 operates in a similar manner to the receiver 54, and a further description of the operation of the receiver 84 is omitted.

In the fourth exemplary embodiment, as described above, transmit data with a large bit width is divided into a plurality of parts and each part is dealt with in accordance with any previous embodiment of the invention. This makes it possible to deal with transmit data with a large bit width without increasing the circuit size of each encoder and each decoder.

The exemplary data transmission method and the exemplary data transmission circuit discussed above have been described in detail with reference to exemplary embodiments. However, the present invention is not limited to the details of these exemplary embodiments, but various improvements and modifications are possible without departing from the spirit and the scope of the invention.

The invention claimed is:

1. A data transmission method comprising the steps of:
   encoding transmit data with a width of n bits (n is an integer equal to or greater than 2), at a transmitting end, into a data code including equal or similar numbers of "1"s and "0"s selected, in accordance with predefined one-to-one correspondence, from $2^m$ codes with a width of m bits (2n>m>n);
   transmitting the encoded m-bit width data code via m signal lines; and
   decoding the m-bit width data code at a receiving end into n-bit width data thereby obtaining received data,
   wherein when the number of "1"s and the number of "0"s included in the encoded m-bit width data code are not equal to each other, amplitude levels of transmitted signals are adjusted such that an average voltage of the m signal lines is maintained constant.

2. The data transmission method of claim 1, wherein m is an odd number, and the number of "1"s and the number of "0"s included in the encoded m-bit width data code are different by 1 from each other.

3. The data transmission method of claim 1, further comprising step of transmitting a clock signal for controlling a transmission rate simultaneously together with the encoded m-bit width data code.

4. The data transmission method of claim 1, wherein a null code is defined at the transmitting end by arbitrarily selecting one of the $2^m$ codes with a width of m bits including equal or similar numbers of "1"s and "0"s, which are not selected as data codes corresponding to respective $2^n$ codes with a width of n bits, and, when successive n-bit transmit data are identical, an encoded m-bit data code corresponding to the n-bit transmit data and the null code are alternately transmitted, and a clock signal is reproduced at the receiving end by detecting a transition of the received m-bit codes, and the received data is output in synchronization with the reproduced clock signal.

5. The data transmission method of claim 4, wherein at the receiving end, when the received m-bit code is a data code the n-bit data produced by decoding the data code is held in a register in synchronization with the reproduced clock signal and the held n-bit data is output as the received n-bit data, but when the received m-bit code is the null code the n-bit data held in synchronization with a previous reproduced clock signal is output as the received n-bit data.

6. The data transmission method of claim 1, further comprising the steps of:
   dividing, at the transmitting end, the transmit data to be transmitted into a plurality of parts, encoding each of the divided data part with a width of n bits into a code including equal or similar numbers of "1"s and "0"s selected, in accordance with the predefined one-to-one correspondence, from the $2^m$ codes with the width of m bits, and transmitting the encoded m-bit width code via m signal lines; and
   decoding each m-bit width code at the receiving end into an n-bit width code thereby obtaining the received data.

7. The data transmission method of claim 6, wherein each of the divided data parts includes an equal number of bits.

8. The data transmission method of claim 7, wherein m is an odd number, and the number of "1"s and the number of "0"s included in the encoded m-bit width code are different by 1 from each other.

9. A data transmission system comprising:
   m signal lines;
   a transmitter for encoding transmit data with a width of n bits (n is an integer equal to or greater than 2) into a data code including equal or similar numbers of "1"s and "0"s selected, in accordance with predefined one-to-one correspondence, from $2^m$ codes with a width of m bits (2n>m>n), and transmitting the encoded m-bit width code via the m signal lines; and
   a receiver for receiving the m-bit width code transmitted from the transmitter and decoding the in-bit width data into n-bit width data thereby obtaining received data,
   wherein when the number of "1"s and the number of "0"s included in the encoded m-bit width data code are not equal to each other, the transmitter adjusts amplitude levels of signals to be transmitted such that an average voltage of the m signal lines is maintained constant.

10. The data transmission system of claim 9, wherein m is an odd number, and the number "1"s and the number of "0"s included in the encoded m-bit width data code are different by 1 from each other.

11. The data transmission system according to claim 9, wherein the m signal lines further include a (m+1)th signal line, and a clock signal that defines a transmission rate is transmitted together with the encoded in-bit width data code via the (m+1) signal lines.

12. The data transmission system of claim 9, wherein the receiver determines whether each bit of the received m-bit code is "1"or "0", based on a difference between a voltage of each signal line and the average voltage of the m signal lines or based on a difference between a voltage of each signal line and an average voltage of remaining (m−1) signal lines.

13. The data transmission system of claim 9, wherein the transmitter defines a null code by arbitrarily selecting one of the $2^m$ codes with a width of m bits including equal or similar numbers of "1"s and "0"s, which are not selected as data codes corresponding to respective $2^n$ codes with a width of n bits, and, when there is no change in the n-bit transmit data over a period equal to or greater than two transfer clocks, the transmitter alternately transmits the encoded m-bit data code corresponding to the n-bit transmit data and the null code; and the receiver reproduces a clock signal by detecting a transition of the received in-bit width codes, and outputs the received data in synchronization with the reproduced clock signal.

14. The data transmission system of claim 13, wherein when the received m-bit data is a data code, the receiver holds the n-bit data decoded from the data code in a register in synchronization with the reproduced clock signal and outputs the decoded n-bit data as the received n-bit data, but when the received m-bit data is the null code, the receiver outputs the n-bit data held in the register in synchronization with a previous reproduced clock signal as the received n-bit data.

15. A transmitter comprising:
an encoder that encodes transmit data with a width of n bits (n is an integer equal to or greater than 2) into a code including equal or similar numbers of "1"s and "0"s selected, in accordance with predefined one-to-one correspondence, from $2^m$ codes with a width of m bits (2n>m>n), and transmits the encoded m-bit width data code via m signal lines; and
m output drivers each for outputting a high level signal or a low level signal to corresponding one of m signal lines depending on the m-bit data code supplied from the encoder, wherein:
the encoder outputs a level control signal; and
when the number of "1"s and the number of "0"s included in the m-bit data code are not equal to each other, the output drivers control the amplitude levels of signals output from the output drivers in accordance with the level control signal such that an average voltage of the m signal lines is maintained constant.

16. The transmitter of claim 15, wherein:
the encoder defines a null code by arbitrarily selecting one of the $2^m$ codes with a width of m bits including equal or similar numbers of "1"s and "0"s, which are not selected as data codes corresponding to respective $2^n$ codes with a width of n bits; and
when there is no change in the n-bit transmit data over a period equal to or greater than two transfer clocks, the encoder alternately supplies the encoded m-bit data code corresponding to the n-bit transmit data and the null code.

17. The transmitter of claim 16, further comprising a control circuit for asserting a control signal when there is no change in the n-bit transmit data over the period equal to or greater than two transfer clocks and the control signal was not asserted at a previous transfer clock,
wherein the encoder outputs the m-bit data code encoded from the n-bit transmit data when the control signal is not asserted, but the encoder output the null code when the control signal is asserted.

18. Means for transmitting data, comprising:
means for encoding transmit data with a width of n bits (n is an integer equal to or greater than 2) at a transmitting end into a data code including equal or similar numbers of "1"s and "0"s selected, in accordance with predefined one-to-one correspondence, from $2^m$ codes with a width of m bits (2n>m>n);

means for transmitting the encoded in-bit width data code via m signal lines; and
means for decoding the m-bit width data code at a receiving end into n-bit width data thereby obtaining received data,
wherein means for transmitting includes means for adjusting amplitude levels of signals to be transmitted such that an average voltage of the in signal lines is maintained constant when the number of "1"s and the number of "0"s included in the encoded in-bit width code are not equal to each other.

19. A data transmission method comprising the steps of:
encoding transmit data with a width of n bits (n is an integer equal to or greater than 2), at a transmitting end, into a data code selected, in accordance with predefined one-to-one correspondence, from $2^m$ codes with a width of m bits (2n>m>n);
transmitting the encoded in-bit width data code via m signal lines;
decoding the m-bit width data code at a receiving end into n-bit width data thereby obtaining received data,
wherein a null code is defined at the transmitting end by arbitrarily selecting one of the $2^m$ codes with a width of in bits which are not selected as data codes corresponding to respective $2^n$ codes with a width of n bits, and, when successive n-bit transmit data are identical, an encoded m-bit data code corresponding to the n-bit transmit data and the null code are alternately transmitted, and
a clock signal is reproduced at the receiving end by detecting a transition of the received m-bit codes, and the received data is output in synchronization with the reproduced clock signal.

20. The data transmission method of claim 19, wherein at the receiving end, when the received m-bit code is a data code, the n-bit data produced by decoding the data code is held in a register in synchronization with the reproduced clock signal and the held n-bit data is output as the received n-bit data, but when the received m-bit code is the null code, the n-bit data held in synchronization with a previous reproduced clock signal is output as the received n-bit data.

21. The data transmission method of claim 19, wherein at the transmitting end, a control signal is asserted when there is no change in the n-bit transmit data over a period equal to or greater than two transfer clocks and the control signal was not asserted at a previous transfer clock, and the m-bit data code encoded from the n-bit transmit data is transmitted when the control signal is not asserted, but the null code is transmitted when the control signal is asserted.

22. A data transmission system comprising:
m signal lines;
a transmitter for encoding data with a width of n bits (n is an integer equal to or greater than 2) into a data code selected, in accordance with predefined one-to-one correspondence, from $2^m$ codes with a width of m bits (2n>m>n), and transmitting the encoded m-bit width code via the m signal lines; and
a receiver for receiving the m-bit width code transmitted from the transmitter and decoding the m-bit width data into n-bit width data thereby obtaining received data, wherein, the transmitter defines a null code by arbitrarily selecting one of the $2^m$ codes with a width of m bits which are not selected as data codes corresponding to respective $2^n$ codes with a width of n bits, and, when there is no change in the n-bit transmit data over a period equal to or greater than two transfer clocks, the transmitter alternately transmits the encoded m-bit data code corresponding to the n-bit transmit data and the null code; and the receiver reproduces a clock signal by detecting a transition of the received m-bit width codes, and outputs the received data in synchronization with the reproduced clock signal.

23. The data transmission system of claim 22, wherein when the received m-bit data is a data code, the receiver holds the n-bit data decoded from the data code in a register in synchronization with the reproduced clock signal and outputs the decoded n-bit data as the received n-bit data, but when the received m-bit data is the null code, the receiver outputs the n-bit data held in the register in synchronization with a previous reproduced clock signal as the received n-bit data.

24. The data transmission system of claim 22, wherein the transmitter further comprises a control circuit for asserting a control signal when there is no change in the n-bit transmit data over a period equal to or greater than two transfer clocks and the control signal was not asserted at a previous clock, and the transmitter transmits the m-bit data code encoded from the n-bit transmit data when the control signal is not asserted, but the transmitter transmits the null code when the control signal is asserted.

* * * * *